United States Patent
Barsoum et al.

(10) Patent No.: US 6,246,267 B1
(45) Date of Patent: Jun. 12, 2001

(54) METHOD AND APPARATUS FOR DETECTING A SINUSOIDAL SIGNAL USING A COUNTER AND QUEUE

(75) Inventors: Maged F. Barsoum, Sunnyvale; Hungming Chang, Cupertino; Eugen Gershon, San Jose; Chien-Meen Hwang, San Jose; Muoi V. Huynh, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/286,998

(22) Filed: Apr. 7, 1999

(51) Int. Cl.$^7$ .................................................. G01R 25/00
(52) U.S. Cl. ................................. 327/13; 327/16; 327/17; 327/78; 327/94
(58) Field of Search .............................. 327/13, 16, 17, 327/78, 94

(56) References Cited

U.S. PATENT DOCUMENTS

| | | | |
|---|---|---|---|
| 5,151,926 | * 9/1992 | Chennakeshu et al. | 375/84 |
| 5,212,444 | * 5/1993 | Abramovich et al. | 324/207.13 |
| 5,404,388 | * 4/1995 | Eu | 379/24 |
| 5,801,835 | 9/1998 | Mitzutani et al. | 356/375 |

* cited by examiner

Primary Examiner—Margaret R. Wambach

(57) ABSTRACT

A method and apparatus for detecting a sinusoidal signal samples a received signal. An error signal generator receives at its inputs a previous sample of the received signal and a current sample of the received signal and generates an error signal based on these previous and current samples. A comparison circuit compares the generated error signal for the current sample to an error threshold value and generates a threshold comparison signal with a first value that indicates the generated error signal is below the error threshold value for a second value that indicates a generated error signal is above the error threshold value. A determination circuit then determines whether the received signal is a sinusoidal signal based on a threshold comparison signal generated for a plurality of samples. The determination circuit includes a counter that maintains a count of the number of threshold comparison signals having the first value within a sampling period.

22 Claims, 5 Drawing Sheets

METHOD AND APPARATUS FOR DETECTING A SINUSOIDAL SIGNAL USING A COUNTER AND QUEUE

FIELD OF THE INVENTION

The present invention relates to the field of signal detection, and more particularly, to the detection of a sinusoidal signal.

BACKGROUND OF THE INVENTION

There are many applications in which the detection of a sinusoidal signal is required. For example, in a multipoint data network, the beginning of a transmission by one station on the network may be indicated by a timing signal formed by one or more sinusoidal signals. Such a timing signal is recognized by receivers on the network as an indication that a packet of data will follow on the network. Accurate and rapid detection of a sinusoidal signal is critical in such an application. However, this is merely one example of the use of a sinusoidal signal detector.

Other examples of applications in which sine wave detection is used includes position detectors (U.S. Pat. No. 5,801,835), and speech recognition devices. In most applications, it is desirable to make the determination that the signal is a sinusoidal signal as quickly as possible. It is also desirable to do so in a manner that employs a relatively minimal amount of logic to implement the detection scheme.

SUMMARY OF THE INVENTION

There is a need for methods and apparatus to detect the sinusoidal signal in manner that is not computationally intensive yet provides a fast detection. The detection scheme should be accurate, but should also allow an adjustable amount of noise or imperfection in the sinusoidal signal.

This and other needs are met by the present invention which provides a sinusoidal signal detector having a sampling circuit that samples a received signal. An error signal generator receives as inputs two previous samples of the received signal and a current sample of the received signal. The error signal generator generates an error signal based upon the previous and current samples. A comparison circuit compares the generated error signal for the current sample to an error threshold value. The comparison circuit generates a threshold comparison signal with the first value that indicates the generated error signal is above the error threshold value. A determination circuit determines whether the received signal is a sinusoidal signal based on the threshold comparison signal generated for a plurality of samples. A determination signal includes a counter that maintains a count of the number of threshold comparison signals having the first value within a sampling period.

The detector of the present invention rapidly and with a relatively minimal amount of logic determines the presence of a sinusoidal signal on an input signal line by predicting the current sample from the previous samples if the signal was a perfect sinusoidal. By comparing the two previous samples of a received signal to a current sample, and comparing the error in the prediction to an error threshold, a plurality of samples may be used to determine whether a sinusoidal signal is detected. If the sinusoidal signal was not perfect, but close, so that a small number of samples did not pass the error threshold, but the majority of the samples are within the error threshold, the sinusoidal signal will still be detected. The present invention operates on any sinusoidal signal that has a known frequency, but has an unknown amplitude and unknown phase. One of the advantages of the invention is that the number of threshold comparison signals that pass the error threshold may be maintained with a simple counter. This is a desirable improvement over the use of cumbersome adders to keep track of the number of error signals that are below the error threshold value.

The earlier stated needs are also met by another embodiment by the present invention which provides a method of detecting a sinusoidal signal that has an unknown amplitude and an unknown phase. The method includes the steps of sampling a received signal to produce a plurality of samples. A current sample is predicted based upon the previous samples. An error signal is produced as a function of a deviation of an actual current sample from a predicted current sample. The error signal is compared to an error threshold. A count is maintained of the number of error signals that are below the error threshold within a given sampling period. It is then determined whether the input signal is a sinusoidal signal as a function of the number of samples of the count.

The foregoing and other features, aspects and advantages of the present invention will become apparent from the following detailed description of the present invention when taken in conjunction with the accompanying drawings.

BREIF DESCRIPTION OF THE DRAWINGS

DETAILED DESCRIPTION OF THE INVENTION

The present invention resolves the difficulties in detecting a sinusoidal signal that has a known frequency, but an unknown amplitude and phase. It performs this detection in a relatively fast and elegant manner, by predicting the value of the current sample of the digitized signal. The accuracy of the prediction is checked, and if a given number of samples within a time window are determined to be relatively close to the prediction, the signal is determined to be a sinusoidal signal. For a perfect sinusoidal signal, the predicted signal will be exactly equal to the actual signal.

The present invention employs a queue and a counter that maintains a count of the number of samples within a given time window that are determined to be relatively close to the prediction. The use of queue in a counter provide a less computationally intensive arrangement for determining the number of these samples that are below the error threshold.

Figure 1:
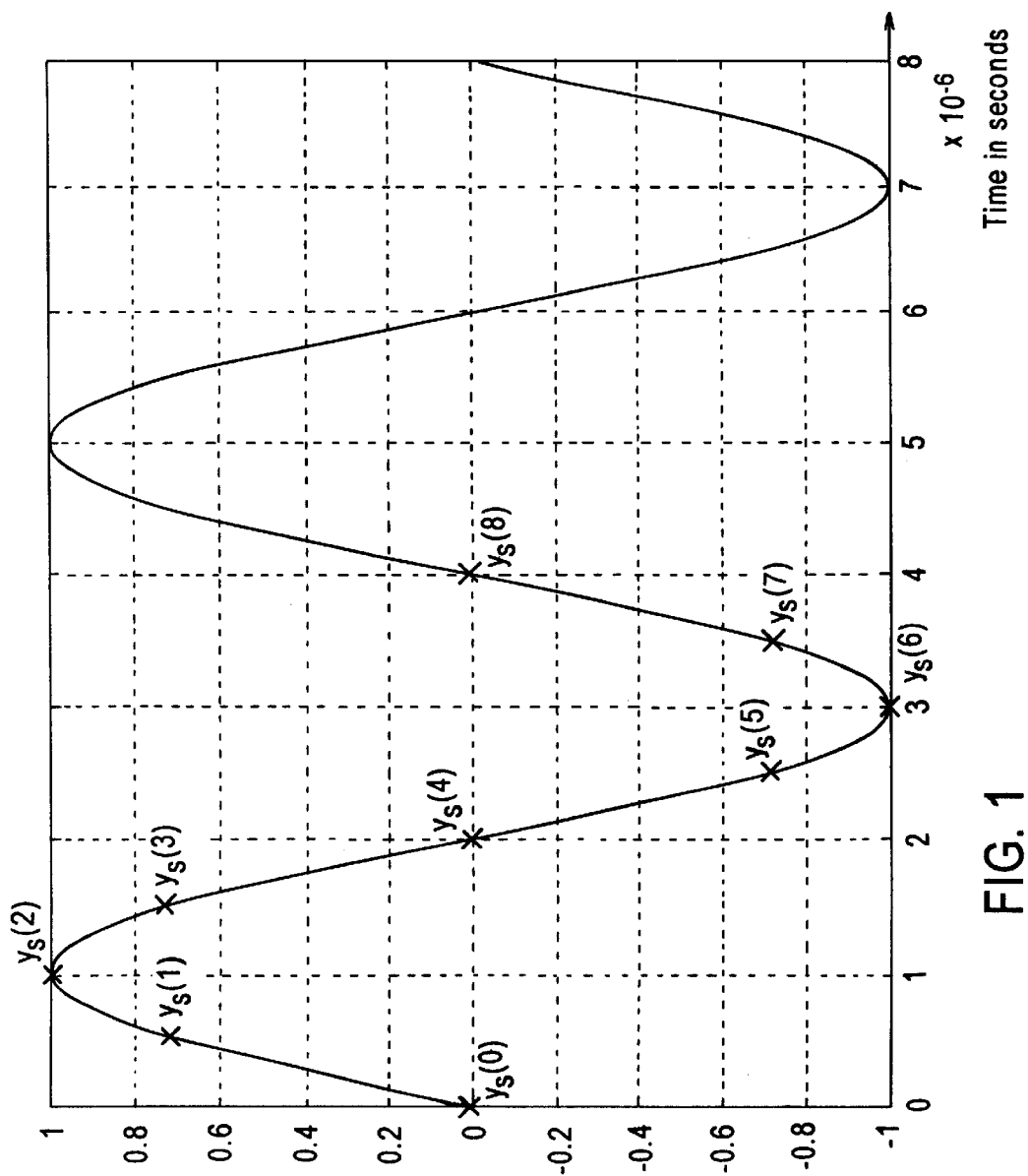
FIG. 1 is an exemplary sine wave detectable at the detection apparatus of the present invention.

An exemplary input signal wave form is depicted in FIG. 1. This signal should be considered exemplary only, however, as the present invention may be used to detect any sine wave with a known frequency.

In the above example, the curve may be represented by the following formula:

$$y(nT)=C_2y((n-1)T)+C_1y((n-2)T) \qquad (1),$$

where T is the sampling period.

Consider a sinusoidal signal at 250 kHz described by the formula $$y(t)=\sin(2\pi ft)$$

where $f=250\times10^3$ Hz. Assume the signal is sampled at 2 MHz so that the period $T=\frac{1}{2}\times10^6=0.5\times10^6$ sec.

If the sampled signal is $y_s(n)$, then $y_s(n)=\sin(2\pi f\, n\, T)$.

For example:

$$y_s(0)=\sin(0)=0$$

$$y_s(1)=\sin(\pi/4)=1/\sqrt{2}$$

$$y_s(2)=\sin(\pi/2)=1$$

$$y_s(3)=\sin(3\pi/4)=1/\sqrt{2}$$

$$y_s(4)=\sin(\pi)=0$$

$$y_s(5)=\sin(5\pi/4)=1/\sqrt{2}$$

$$y_s(6)=\sin(1.5\pi)=1$$

$$y_s(7)=\sin(7\pi/4)=1/2+ee$$

$$y_s(8)=\sin(2\pi)=0$$

For that case, the coefficients are $C_2=\sqrt{+e}$,rad 2 and $C_1-1$.

As examples of this formula (1):

$$\sqrt{2}y_s(1)-(1)y_s(0)=\sqrt{2}(1/\sqrt{2})-(1)(0)=1=y_s(2) \qquad a)$$

$$\sqrt{2}y_s(2)-(1)y_s(1)=(\sqrt{2})(1)-(1)(1/\sqrt{2})=2-1/\sqrt{2}=1/\sqrt{2}=y_s(3) \qquad b)$$

$$y_s(4)=\sqrt{2}y_s(3)-(1)y_s(2) \qquad c)$$

$$y_s(5)=\sqrt{2}y_s(4)-(1)y_s(3) \qquad d)$$

The formula given above holds for any phase i.e., if $y(t)=\sin(2\pi ft+\phi)$, where $\phi$ is any phase. Hence, the coefficients remain the same and the formula holds, even if the amplitude and phase of the received signal changes, as long as the frequency and the sampling rate remain the constant. If the sinusoidal frequency or sampling rate changes, the coefficients must also be charged.

The general formula for determining the values of $2_2$ and $C_1$ are $C_2=\sin(4\pi fT)/\sin(2\pi fT)$ and $C_1=-1$, where f is the frequency of the sinusoidal, and T is the sampling period (T=1/sampling rate). $C_1$ will always be $-1$. Hence, $C_1$ multiplication can be eliminated in all cases, and the sign to the adder simply changed. However, in the following description, the constant $C_1$, will be provided in the calculation of the predicted sample.

Figure 2:
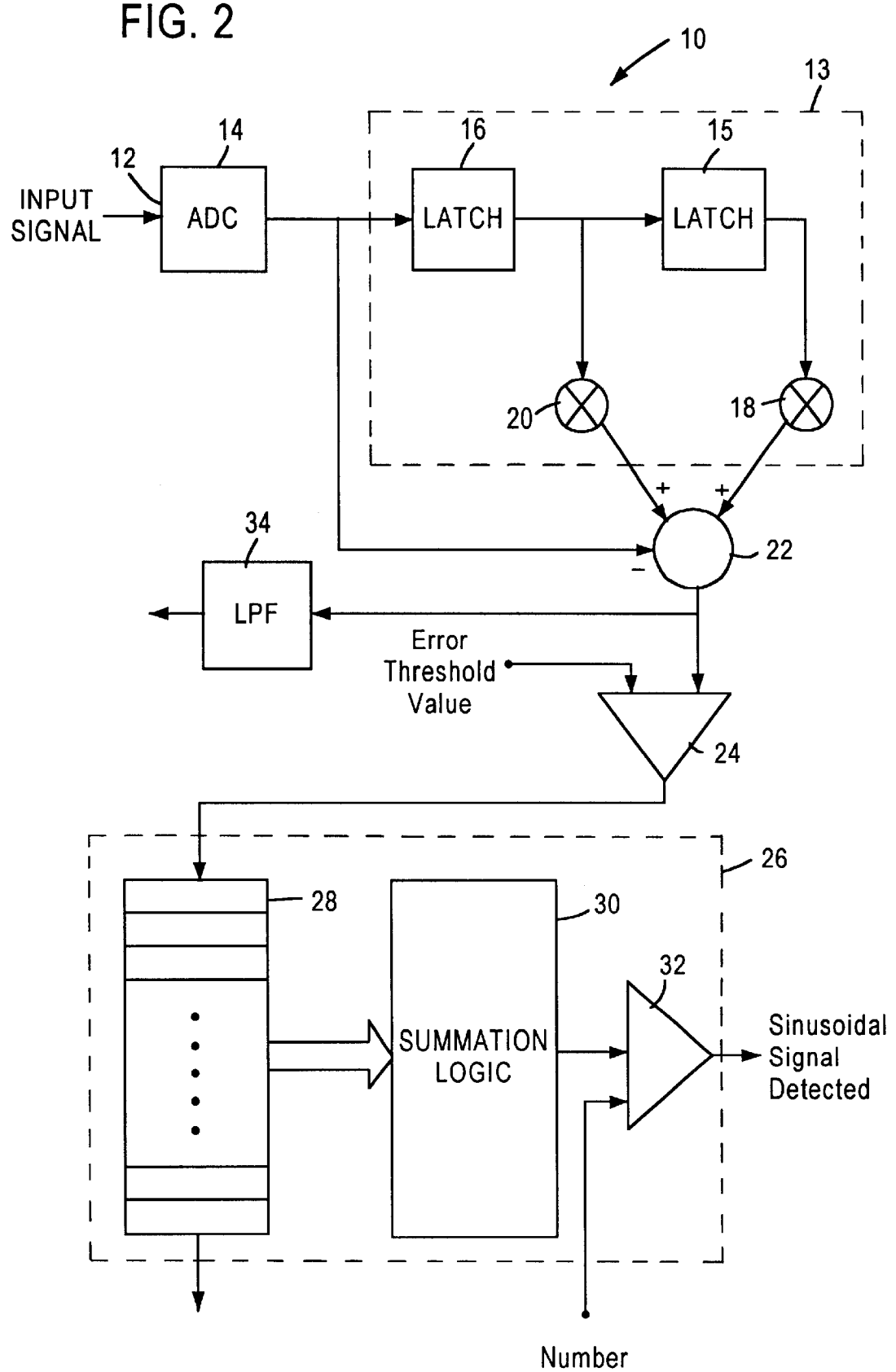
FIG. 2 is a block diagram of a sinusoidal signal detector constructed in accordance with an embodiment of the present invention.

An exemplary embodiment of a sinusoidal signal detector in accordance with the present invention is depicted in FIG. 2. The detector 10 receives an input signal at an input 12 to the detector 10. For instance, the input signal may be that received over a network connection, such as a multipoint network. A conventional analog to digital converter (ADC) 14 operates to sample and digitize the input signal. The input signal may be provided, in addition to the detector 10, to other areas of the circuitry of the particular device that is to process the signal. The digitized signal produced by the analog to digital converter 14 is delayed by a delay circuit 13. In the preferred embodiment of the present invention, the delay circuit 13 includes two delays 15, 16. In the following description, the delay 15 will be described as the first delay, and the delay 16 will be described as the second delay. The arrangement is such that when an input signal is sampled, the oldest sample of the input signal will be in the first delay 15 at the same time that the next oldest sample will be in the second delay 16 and the most current sample will be at the output of the analog to digital converter 14. Referring to the earlier stated formula, the oldest sample will be the n–2 sample, the next oldest sample will be the n–1 sample, and the most current sample is the n sample.

The present invention does not require digitization of the received analog signal. In such embodiments, the analog to digital converter 14 is not used, and the analog signal is processed in the same manner as described below.

The delay circuit 13 includes first and second multipliers 18, 20. The first multiplier 18 is coupled to the output of the first delay 15. The first multiplier 18 operates to multiply the oldest sample (n–2) output by the first delay 15 by a first constant $C_1$ (see formula (i)). Similarly, the second multiplier 20 is coupled to the output to the second delay 16 and multiplies the next oldest sample (n–1) by a second constant $C_2$. The two constants $C_1$ and $C_2$ are set based upon the given sinusoidal frequency and sampling rate. For example, with a sinusoidal signal having a frequency of 250 kHz, and a sampling rate set at 2 MHz, the constant $C_2$ is selected at $\sqrt{2}$, and the constant $C_1$ is selected at $-1$. However, these coefficients would need to change upon a change in the sinusoidal frequency or in the sampling rate.

The multiplied samples are supplied to an error signal generator 22 as positive inputs. The error signal generator 22 also receives a current sample (n) directly from the analog to digital converter 14. As apparent from the earlier shown formula (1), the multiplied earlier samples n–2, n–1 should be equal to the current sample n if the signal is a sinusoidal signal. The current sample from the analog to digital converter 14 is therefore supplied as a negative input to the error signal generator 22.

Having received the multiplied first and second samples as positive inputs and subtracting the current sample from the sum of the first and second multiplied samples, the error signal generator 22 produces an error signal that is the measure of the prediction error for the current sample. The prediction error may serve as a measure of the quality of the signal; as will be described later. The error signal produced by the error signal generator 22 is provided as a first input to a comparison circuit 24, which is formed by a comparator in the preferred embodiment of the present invention. The second input to the comparator 24 is an error threshold value that may be defined by the user of the detector 10. The comparison circuit 24 operates to the compare the error signal for a current sample to the error threshold value. If the error signal for the current sample is below the error threshold value, the threshold comparison signal produced by the comparison circuit 24 is provided with a specified value such as a 1. When the error signal for a current sample is above the specified error threshold value, the threshold comparison signal generated by the comparison circuit 24 is produced with a second value, such as zero. Hence, each threshold comparison signal produced by the comparison circuit 24 will have a value that indicates whether the generated error signal for that current sample is above or below the error threshold value.

The threshold comparison signals, with values indicating whether the generated error signals are above or below the error threshold value, are sent to a determination circuit 26 that determines whether the received signal is a sinusoidal signal based upon the threshold comparison signals generated for a plurality of samples. The determination circuit 26 includes a queue 28, summation logic 30 and a comparator 32.

The queue 28 is a first in, first out queue that will store a window of threshold comparison signals for a plurality of samples of an input signal. A threshold comparison signal will enter the top of the queue and as more threshold comparison signals are received, eventually will leave the queue 28.

The total number of threshold comparison signals within the queue 28 at any one time that indicate the prediction of the associated current samples are within the error threshold, (i.e. have a value of 1) is a measure of the conformance of the input signal to a sinusoidal shape. In other words, if nearly all of the entries in the queue 28 are set to one, indicating that the error in the prediction of those samples were below an error threshold value, then the formula is considered satisfied and the input signal is considered to be a sinusoidal signal. However, if most of the entries of the queue 28 are not set to one, indicating that the error in predicting the current samples fell above the error threshold value, then the input signal is not a sinusoidal signal. The ratio of signals with the value of 1 to signals with a value of 0 in the queue 28 considered to indicate a sinusoidal signal will define a signal purity level in the detection of a sinusoidal signal. The total number of entries with a value of 1 in the queue 28 that will trigger a sinusoidal signal detection is specified by the designer or user in accordance with a desired confidence level and provided as an input to the comparator 32.

Summation logic 30 examines the queue 28 after each new threshold comparison signal is entered into the queue 28. Summation logic 30 performs an addition of the entries to determine the total number of entries with the first value (i.e. value=1) present in the queue 28 at any particular time. The summation signal produced by the summation logic 30 is provided as a second input to comparator 32. The summation signal is compared by the comparator 32 with the specified number of valid entries. When the summation signal exceeds the specified number, a sinusoidal signal detected signal is output by the comparitor 32 (i.e. is asserted).

The quality of the sinusoidal signal is measured by the prediction error generated by the error signal generator 22. The prediction error is averaged by a low pass filter 34 and forms a measure of the quality of the signal. The lower the error, the higher the quality of the signal. The quality signal may be provided to other circuitry.

An exemplary embodiment of the summation logic 30 that sums up the number of threshold comparison signals that are set to indicate that the error signal is below the error threshold value, is depicted in the block diagram of FIG. 3. The summation logic 30 comprises a plurality of adders 34. The number of adders 34 is equal to one less than the number of entries in the queue 28. For example, if there are 20 entries in the queue 28, for holding 20 consecutive threshold comparison signals, then the summation logic 30 comprises 19 adders 34.

Each of the adders 34 is coupled to receive the value of the threshold comparison signal of the respective queue entry. Furthermore, each adder 34 has an A and a B input. The A input of each adder 34 receives the value of the threshold comparison signal of the associated entry in the queue 28. The entry is provided to the least significant bit (LSB) of the A input of the adder 34. The B input of each adder 34 receives the output of the previous adder 34. The other bits of the A input should be set to zero.

The width of each adder should be set to M=$\log_2$(N+1) bits. This ensures that there is no overflow.

Figure 3:
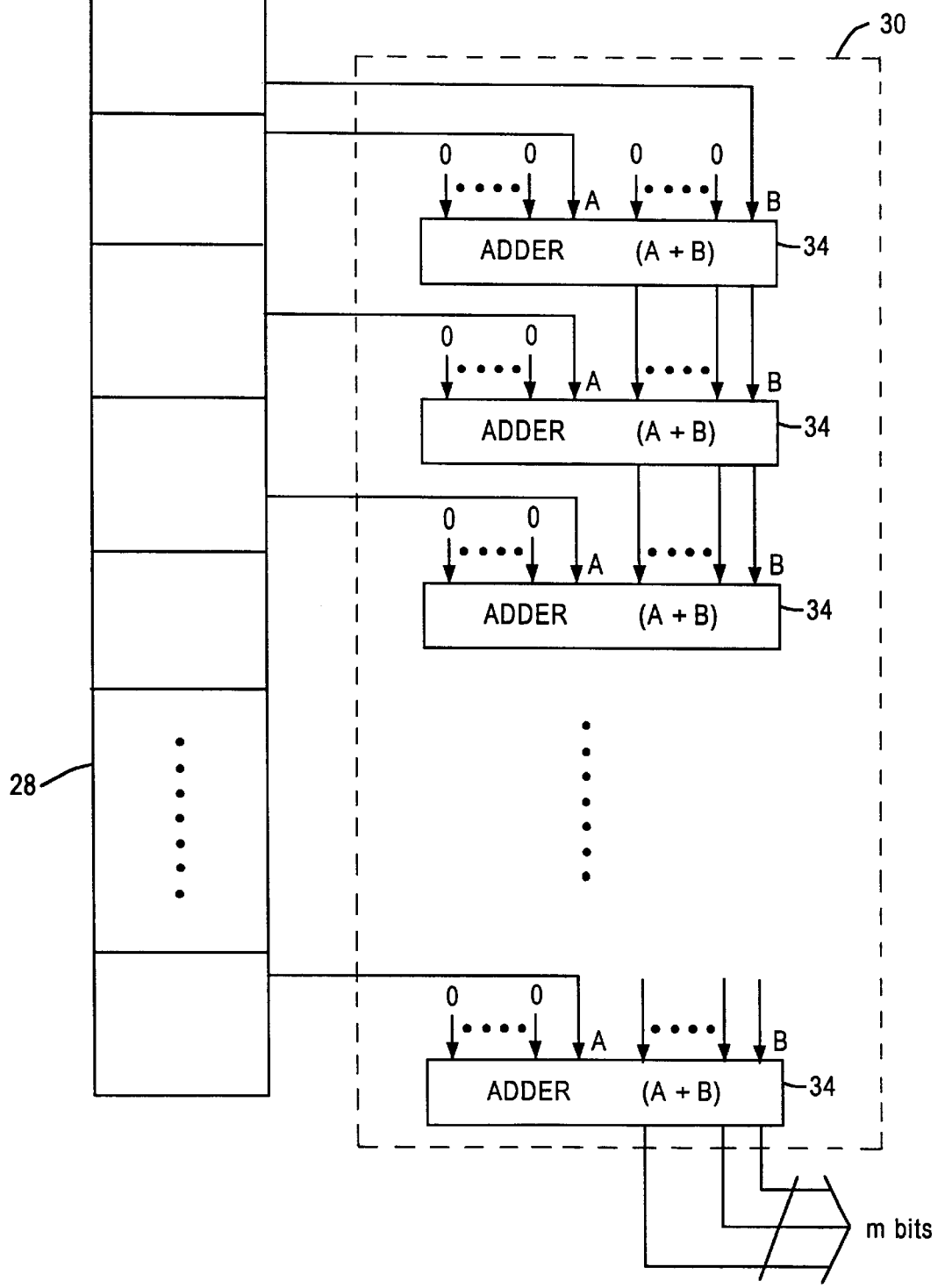
FIG. 3 is a block diagram of exemplary summation logic in accordance with an embodiment of the present invention.

As can be appreciated by the diagram of FIG. 3, the value of the first two queue entries are added. The value of each queue entry is then added to the sum of the values in the previous queue entries. In the preferred embodiment, each value in each queue entry is one bit.

The output of the summation logic 30 is provided as a summation signal to the comparator 32. Although a specific embodiment of the summation logic 30 is depicted and described, should be apparent to one of ordinary skill in the art that other types of summation logic 30 may be employed.

Figure 5:
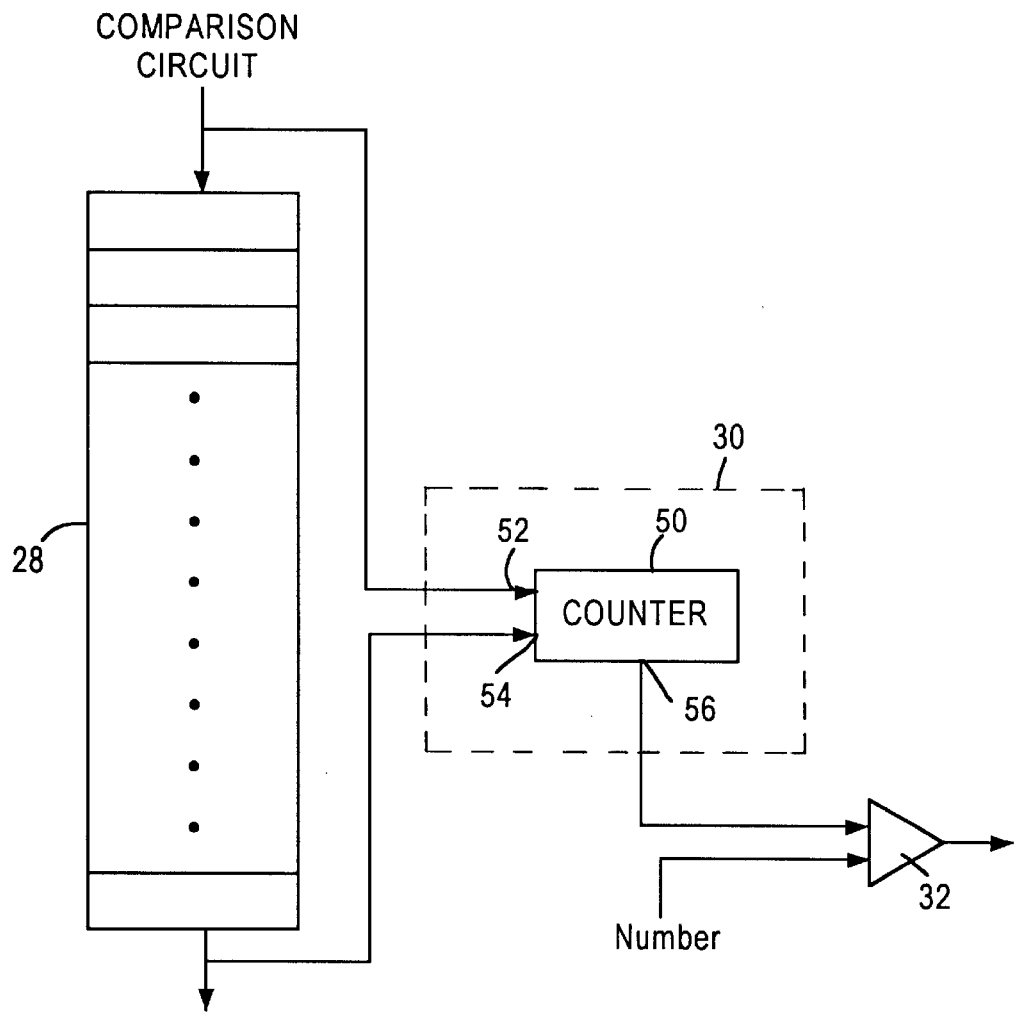
FIG. 5 is a block diagram of a counter arrangement used as the summation logic in another embodiment of the present invention.

FIG. 5 is a block diagram of an alternative embodiment of a summation logic 30. In this embodiment, the summation logic 30 comprises a counter 50 that is preferably an up-down counter. The counter 50 has a first input 52 coupled to the input of the queue 28. The counter 50 has a second input 54 coupled to the output of the queue 28. The output of the counter 56 is a count signal provided to one input of the comparator 32.

With every new threshold comparison signal entered into the queue 28, the values of the two inputs 52, 54 to the counter 50 change. Depending upon the value of the inputs, the counter 50 will either increment by one, decrement by one, or remain unchanged. The coding is as follows:

| INPUT | | |
|---|---|---|
| 52 | 54 | Counter Action |
| 0 | 0 | None |
| 1 | 0 | Increment by One |
| 0 | 1 | Decrement By One |
| 1 | 1 | None |

From the above chart, it can be seen that the count maintained within the counter 50 is incremented whenever a threshold comparison signal whose predicted error is below the error threshold enters the queue, as long as there is a threshold comparison signal whose predicted error is below the error threshold exiting the queue at the same time. Conversely, the count in the counter 50 is reduced by one if the entry entering the queue 28 is above the error threshold, while the entry exiting the queue is below the error threshold. The count is maintained whenever the value of the entry entering the queue is the same as the value of the entry exiting the queue.

The count contained in the counter 50 is provided at the output 56 to the comparator 32 for comparison to the specified number after each sample has been taken. This provides a rapid detection of the sinusoidal signal since the signal is considered detected as soon as the count exceeds the threshold (specified number) at the comparator 32.

The embodiment of the present invention providing a counter instead of the adders of FIG. 3 provides a less computationally intensive and less expensive arrangement for maintaining the count of entries of a certain type of a queue.

Figure 6:
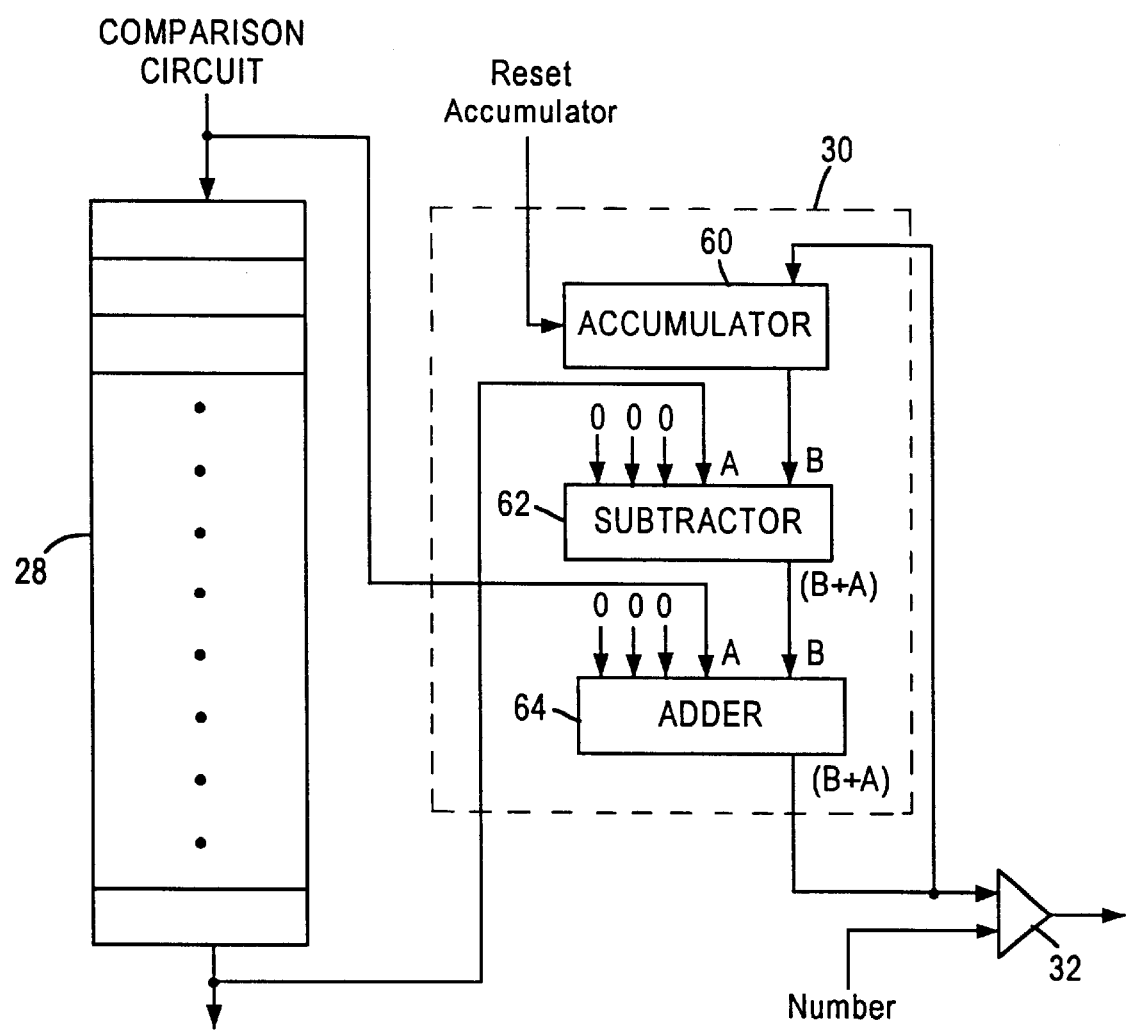
FIG. 6, is a block diagram of the summation logic in still another embodiment of the present invention.

FIG. 6 depicts still another embodiment of the summation logic 30. The summation logic 30 comprises an accumulator 60, a subtractor 62, and an adder 64. The width of the accumulator 60, the subtractor 62 and the adder 64 should be M bits, where M=$\log_2$(N+1), as in the embodiment of FIG. 3. The queue input is provided to the LSB of the A inputs of the adder 64, with the other A inputs set at zero. The output of the queue 28 is provided to the LSB of the A inputs of the subtractor 62, with the other A inputs set to zero. The output of the accumulator 60 is provided to the B input of the subtractor 62, which produces the difference B−A at its output. The B input of the adder 64 receives the difference and adds it to A input to produce A+B at the adder output. The value at the adder output is the summation signal provided to the comparator 32. The reset accumulator signal is reset at the beginning. The accumulator 60 is fed back the summation signal and provides this to the B input of subtractor 62.

Figure 4:
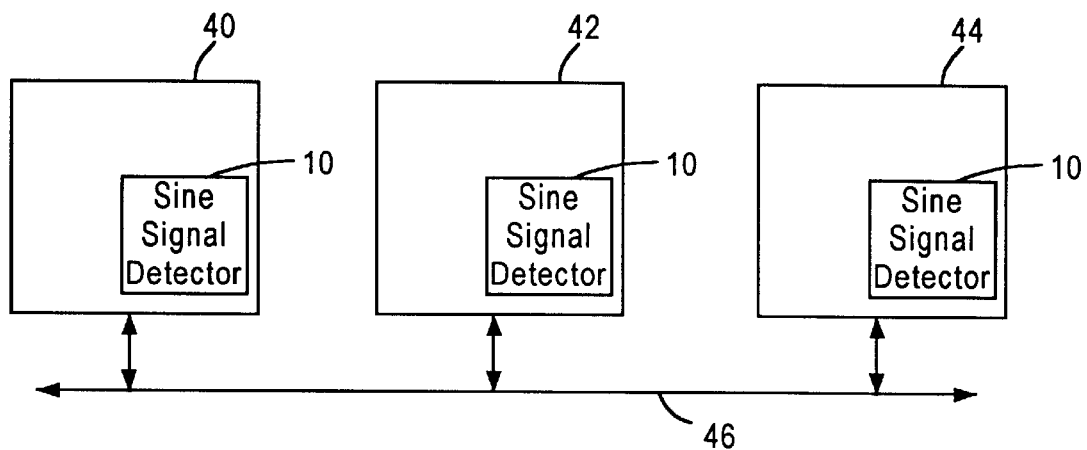
FIG. 4 is a block diagram of an exemplary multipoint network in which the sinusoidal signal detector may be advantageously employed.

The present invention may be used in a variety of different applications that require the detection of a sinusoidal signal. An example of a system in which the sinusoidal signal detector 10 of the present invention is particularly advantageous is within a multipoint network such as that depicted in FIG. 4. The network includes stations 40, 42 and 44, each having a sinusoidal signal detector 10 as depicted in FIG. 2. The stations 40–44 are connected by medium 46, whether wired or wirelessly. When one of the stations 40 desires to transmit a packet of data to another station, 42 or 44, the station 40 identifies the beginning of the packet by producing a "time mark". This special mechanism is required for receivers to identify the beginning of the packet. The time mark may consist of 1 or more cycles of a sinusoidal wave form. It is important for the receiving station 42, 44, to match the pattern to identify the location of the packet start and perform demodulation. Hence, each station 40–44 on the network includes a sinusoidal signal detector 10 to accurately recognize the presence of a sinusoidal signal at its input.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A sinusoidal signal detector comprising:
   a sampling circuit that samples a received signal;
   an error signal generator that receives as inputs two previous samples of the received signal and a current sample of the received signal and generates an error signal based on the previous and current samples;
   a comparison circuit that compares a generated error signal for the current sample to an error threshold value and generates a threshold comparison signal with a first value that indicates the generated error signal is below the error threshold value or a second value that indicates the generated error signal is above the error threshold value; and
   a determination circuit that determines whether the received signal is a sinusoidal signal based on the threshold comparison signals generated for a plurality of samples, the determination circuit including a counter that maintains a count of the number of threshold comparison signals having the first value within a sampling period.

2. The detector of claim 1, wherein the determination circuit further includes a queue coupled to the comparison circuit and that queues the threshold comparison signals.

3. The detector of claim 2, wherein the counter is an up-down counter having a first input coupled to the threshold comparison circuit and a second input coupled to an output of the queue.

4. The detector of claim 3, wherein the up-down counter is responsive to signals at the first and second inputs such that the count in the up-down counter is incremented by one when the threshold signal comparison signal at the first input is the first value and the threshold comparison signal at the queue output is the second value.

5. The detector of claim 4, wherein the up-down counter is responsive to signals at the first and second inputs such that the count in the up-down counter is decremented by one when the threshold signal comparison signal at the first input is the second value and the threshold comparison signal at the queue output is the first value.

6. The detector of claim 5, wherein the up-down counter is responsive to signals at the first and second inputs such that the count is maintained at the current count when the threshold signal comparison signal at the first input has the same value as the value of the threshold comparison signal at the queue output.

7. The detector of claim 6, wherein the up-down counter includes an output at which the count is output.

8. The detector of claim 7, wherein the determination circuit further includes a comparator that compares the count with a defined number and generates a sinusoidal signal detected signal when the count exceeds the defined number.

9. The detector of claim 8, further comprising a delay circuit that includes first and second delays that hold consecutive samples of the received signal.

10. The detector of claim 9, wherein the delay circuit further includes a first multiplier that multiplies the sample held by the first delay by a first coefficient, and a second multiplier that multiplies the sample held by the second delay by a second coefficient.

11. The detector of claim 10, wherein the second delay has an input coupled to receive the received signal and an output connected through the second multiplier to a second input of the error signal generator, the first delay has an input coupled to the output of the second delay and an output connected through the first multiplier to a first input of the error signal generator, and the error signal generator has a third input that directly receives the received signal.

12. The detector of claim 11, wherein the first and second coefficients have values such that $y(nT) = C_2 y((n-1)T) + C_1 y((n-2)T)$ is satisfied for an input signal that is a sinusoidal signal, where $C_1$ is the first coefficient, $C_2$ is the second coefficient, n−2 is the value of the first sample, n−1 is the value of the second sample, and n is the value of the current sample.

13. A method of detecting a sinusoidal signal that has an unknown amplitude and an unknown phase, comprising the steps of:
   sampling a received signal to produce a plurality of samples;
   predicting a current sample based upon previous samples;
   producing an error signal as a function of a deviation of an actual current sample from a predicted current sample;
   comparing the error signal to an error threshold;
   maintaining a count of the number of error signals that are below the error threshold within a given sampling period; and
   determining whether the input signal is a sinusoidal signal as a function of the number of samples of the count.

14. The method of claim 13, wherein the step of comparing the error signal to an error threshold includes generating a threshold comparison signal with a first value when the error signal for a sample is below the error threshold and the threshold comparison signal with a second value when the error signal for a sample is above the error threshold.

15. The method of claim 14, wherein the step of determining includes queuing the threshold comparison signals within a queue having an input and an output.

16. The method of claim 15, wherein the step of maintaining a count includes incrementing the count when the input to the queue is a threshold comparison signal with a first value and the output of the queue is a threshold comparison signal with a second value.

17. The method of claim 16, wherein the step of maintaining a count includes decrementing the count when the input to the queue is a threshold comparison signal with a second value and the output of the queue is a threshold comparison signal with a first value.

18. The method of claim 17, wherein the step of maintaining a count includes maintaining the count at the current count when the threshold comparison signal at the input of the queue has the same value as the threshold comparison signal at the output of the queue.

19. The method of claim 18, wherein the count is maintained within a counter having a first input coupled to the input of the queue and a second input coupled to the output of the queue.

20. The method of claim 19, wherein the step of determining includes generating a sinusoidal signal detected signal when the count exceeds a specified number.

21. The method of claim 20, wherein the step of predicting a current sample includes multiplying a first sample by a first coefficient to produce a first product, a second sample by a second coefficient to produce a second product, and adding the first and second products to produce a predicted current sample.

22. The method of claim 21, wherein the step of producing an error signal includes subtracting the actual current sample from the predicted current sample.

* * * * *